United States Patent [19]
Irrinki et al.

[11] Patent Number: 5,822,228
[45] Date of Patent: Oct. 13, 1998

[54] METHOD FOR USING BUILT IN SELF TEST TO CHARACTERIZE INPUT-TO-OUTPUT DELAY TIME OF EMBEDDED CORES AND OTHER INTEGRATED CIRCUITS

[75] Inventors: V. Swamy Irrinki, Milpitas; Yervant D. Lepejian, Palo Alto, both of Calif.

[73] Assignees: LSI Logic Corporation; Heuristic Physics Laboratories, Inc., both of Milpitas, Calif.

[21] Appl. No.: 863,798

[22] Filed: May 27, 1997

[51] Int. Cl.$^6$ .................................................. G06F 1/04
[52] U.S. Cl. ........................ 364/580; 395/551; 395/550; 395/555; 371/21.1; 371/22.1; 371/22.6
[58] Field of Search .................. 364/580; 395/551, 395/555, 550; 371/21.1–21.6, 22.1–22.6

[56] References Cited

U.S. PATENT DOCUMENTS

| | | | |
|---|---|---|---|
| 5,410,547 | 4/1995 | Drain ........................................ | 364/580 |
| 5,568,437 | 10/1996 | Jamal ...................................... | 371/21.1 |
| 5,664,166 | 9/1997 | Isfeld ...................................... | 395/551 |
| 5,689,690 | 11/1997 | Lesmeister et al. ..................... | 395/555 |
| 5,701,308 | 12/1997 | Attaway et al. ......................... | 371/22.3 |
| 5,724,562 | 3/1998 | Ishiwaki et al. ......................... | 395/551 |
| 5,724,615 | 3/1998 | Ishii ........................................ | 395/551 |

*Primary Examiner*—James P. Trammell
*Assistant Examiner*—Hien Vo
*Attorney, Agent, or Firm*—Conley, Rose & Tayon; B. Noel Kivlin

[57] ABSTRACT

A system and method for using a BIST generator and a BIST compactor to characterize the propagation delay time of a high-speed embedded cores and integrated circuits in general. In one embodiment, an external clock is provided having a positive edge and a negative edge. The BIST generator and test compactor is configured to apply a set of test inputs to the integrated circuit in response to the positive edge, and the BIST compactor is configured to latch a set of outputs from the integrated circuit in response to the negative edge, and determine if the set of outputs represent a valid test result. The validity determination is monitored, and as long as the test result is valid, it is determined that the propagation delay time is less than the time interval between the positive and negative transitions. The propagation delay time can then be measured by reducing the time interval until invalid test results appear. This method provides the means to measure propagation delays of embedded cores more accurately using since tester pulse widths are more accurately measured than tester channel to channel accuracy.

21 Claims, 3 Drawing Sheets

METHOD FOR USING BUILT IN SELF TEST TO CHARACTERIZE INPUT-TO-OUTPUT DELAY TIME OF EMBEDDED CORES AND OTHER INTEGRATED CIRCUITS

BACKGROUND OF THE INVENTION

1. Field of the Invention

This invention relates to the field of built-in self test modules for integrated circuits, and more particularly, to a system and method for using built-in self test modules to determine the propagation delay of embedded cores (both logic and memory cores) and integrated circuits in general.

2. Description of the Related Art

It is common practice for the manufacturers of application specific integrated circuit (ASIC) chips to test the functionality of the ASIC chips at the manufacturing site. After the chips have been tested and certified for shipment, the users generally depend on the reliability of the chips for their own system design. As the density and complexity of ASIC chips increases, this reliability becomes more difficult to attain. Before the ASIC chips are released for shipment, they typically undergo testing to verify the functionality of the chip. This is necessary because it is not uncommon for a significant percentage of ASIC chips to fail due to manufacturing defects and degradation faults.

In the past, ASIC chips have been tested using external Automatic Test Equipment (ATE) at the manufacturing site. Since speed is an issue, and since it is often difficult to provide external access to certain chip functionality, an increasingly standard technique is the use of built-in self-test (BIST) circuitry. In this technique, additional hardware is added to a design so that testing is accomplished with a reduced need for external special purpose testing hardware. One popular example of BIST circuitry is the use of a pseudorandom vector generator and a data compactor. The generator produces the test vectors to be applied to a circuit under test and the compactor reduces the response to these vectors to a single value (e.g., 16 or 32 bits) known as the signature. It is then possible for the ATE to initialize or provide parameters to the generator and examine signatures from the compactor to verify the functionality of the chip.

The propagation delay of embedded cores and integrated circuits in general is becoming an important issue in today's high density memories and complex embedded cores which are designed with minimum timing margins. The minimized margins in conjunction with possible process variations may result in a higher incidence of erratic or non-functional devices. A need exists for a factory/manufacturing test measurement of input-to-output delay to verify functional devices and identify marginal or non-functional devices. However, since the delays are so small, the two current methods for characterizing the delays are unsatisfactory. The first current method is to design the ATE to operate at very high speeds, which adds a tremendous cost to the price of the test equipment. The second current method is to provide a method for multiplexing inputs and outputs of embedded cores so they can be accessed and tested from outside. This quickly becomes impractical for sequential test data streams.

SUMMARY OF THE INVENTION

The need for a practical, affordable method for characterizing the propagation delay of embedded cores and integrated circuits in general is in large part solved by a method for using a BIST generator and a BIST compactor to characterize the propagation delay time of a high-speed core or other integrated circuit. In one embodiment, an external ATE clock is provided having a positive edge and a negative edge. The BIST generator is configured to apply a set of test inputs to the embedded core in response to the positive edge, and the BIST compactor is configured to latch a set of outputs from the embedded core in response to the negative edge. This opposite-edge triggering method allows for a much greater time resolution than the current methods. The BIST compactor is also configured to convert the set of outputs into a signature, which is then forwarded to the ATE to determine if the set of outputs represents a valid test result. The validity determination is monitored, and as long as the test result is valid, it is determined that the propagation delay time is less than the time interval between the positive and negative transitions. The propagation delay time can then be measured by reducing the time interval between the positive and negative edges until invalid test results appear. This invention may advantageously provide more accurate measurement of propagation delay in embedded cores since pulse widths are more accurately determined than tester channel to channel accuracy.

Broadly speaking, the present invention contemplates a system for determining the propagation delay of an embedded core or other integrated circuit. The system comprises a test generator configured to provide a set of test inputs to the integrated circuit in response to a first transition in a first clock signal, a test compactor configured to latch a set of outputs from the integrated circuit in response to a second transition in a second clock signal, and a clock circuit coupled to provide said first and second clock signals. The test compactor converts the set of outputs to a signature which is used to determine a test validity result, and the system determines that the propagation delay time is less than the time interval between the first and second transitions if the signature indicates a valid test result.

The invention further contemplates a system for determining the propagation delay of a synchronous embedded core or other synchronous integrated circuit. The system comprises a test generator configured to provide a set of test inputs to the integrated circuit, a clock circuit configured to provide a first transition of a first clock signal to the integrated circuit to cause it to operate on the set of test inputs, and a test compactor configured to latch a set of outputs from the integrated circuit in response to a second transition of a second clock signal from the clock circuit. The system is configured to determine that the propagation delay time is less than the time interval between the first and second transitions if the test compactor converts the set of outputs into a signature which indicates a valid test result.

BRIEF DESCRIPTION OF THE DRAWINGS

Other objects and advantages of the invention will become apparent upon reading the following detailed description and upon reference to the accompanying drawings in which.

Figure 1:
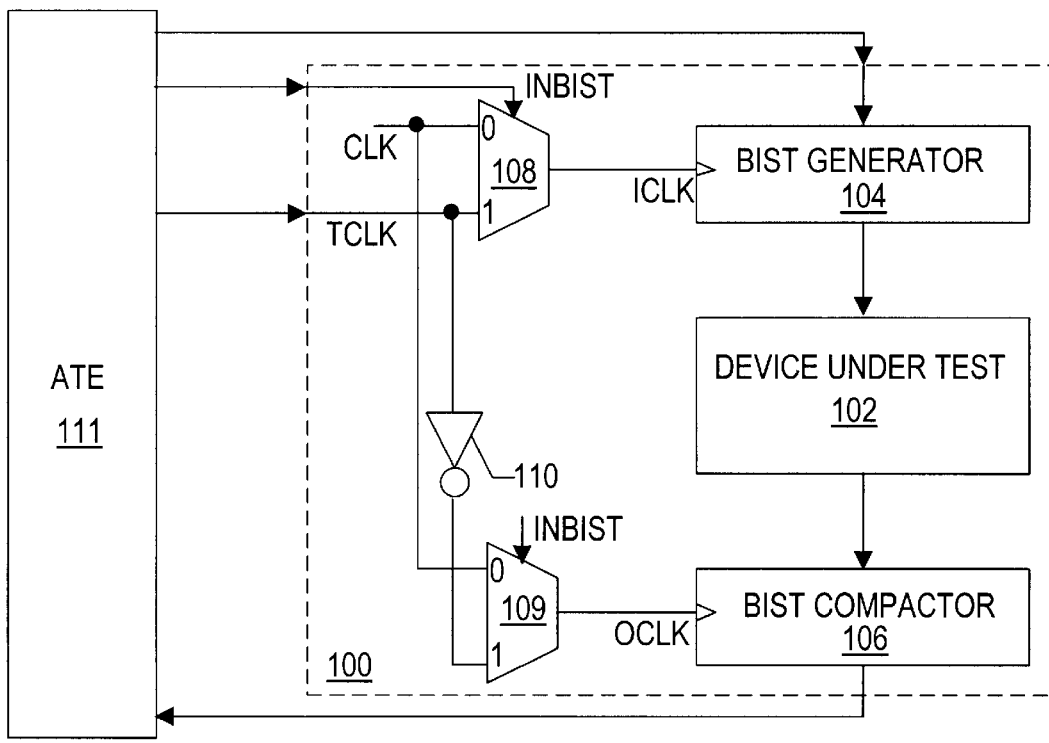
FIG. 1 illustrates a first embodiment of a system for determining the propagation time of embedded cores and integrated circuits in general.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to FIG. 1, a system is shown for characterizing the propagation delay time of an integrated circuit device 102 on a chip 100. It is noted that the device 102 is typically an embedded core, although this system will operate to characterize the propagation delay of integrated circuits in general. The device 102 has associated with it a test generator 104 and a test compactor 106 which are coupled to an automated tester (ATE) 111. The test generator 104 and compactor 106 are preferably BIST modules residing on chip 100 with device 102. The test generator 104 provides a sequence of test input sets to the device 102. Each test input set includes all the inputs required for the device 102 to perform a desired function. The success of the test is indicated by converting a set of outputs from the device 102 into a signature, which is then sent to ATE 111 for comparison with an expected signature. The conversion is performed by the test compactor 106. The test compactor 106 preferably latches the outputs from the device 102 prior to processing them.

The BIST modules are run under the control of ATE 111, which has a maximum operating frequency which may be insufficient for performing propagation delay measurements using current techniques. In one configuration, ATE 111 has a minimum cycle time of 15 nanoseconds, but the duty cycle is adjustable to provide a minimum pulse width as small as 3 nanoseconds. ATE 111 provides a mode signal INBIST to chip 100 to indicate the desired use of an alternate clock configuration.

Two clock configurations are used to conduct the device tests. Two multiplexers 108, 109 serve to switch between clock configurations. When signal INBIST is de-asserted, the test generator's clock input ICLK and the test comparator's clock input OCLK are both driven by an internal clock source CLK. This is the normal BIST clock configuration with both ICLK and OCLK being in synchronization. This configuration is used to test the general functionality of device 102.

Figure 2:
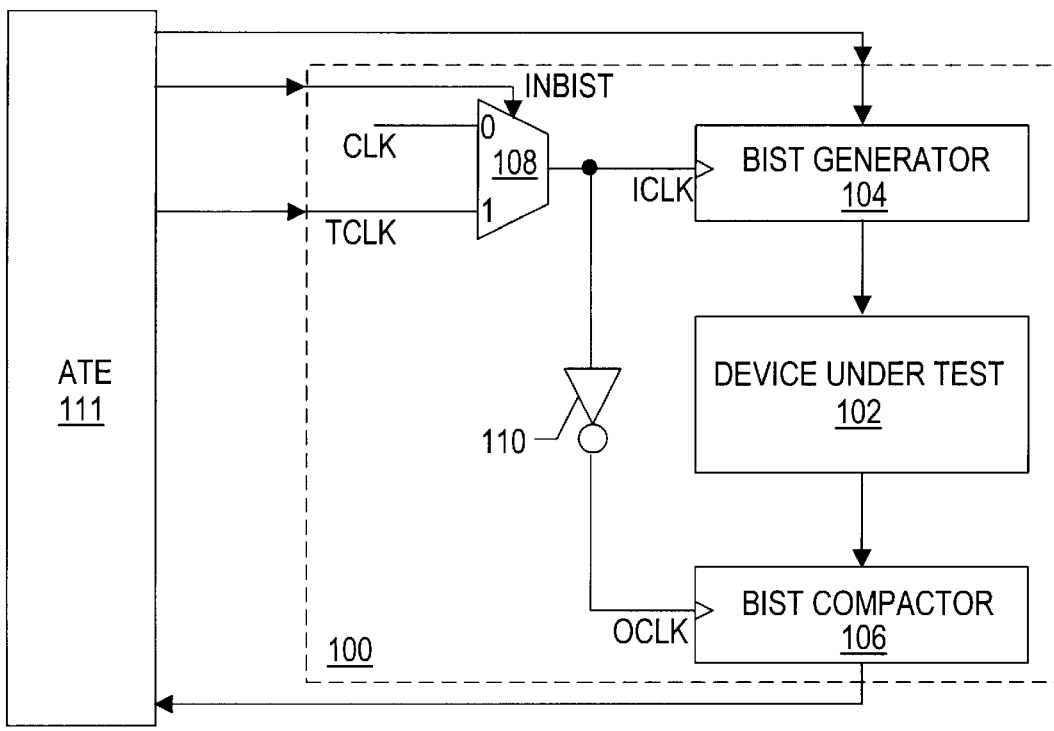
FIG. 2 illustrates a second embodiment of a system for determining the propagation time of asynchronous embedded cores and integrated circuits.
Figure 3:
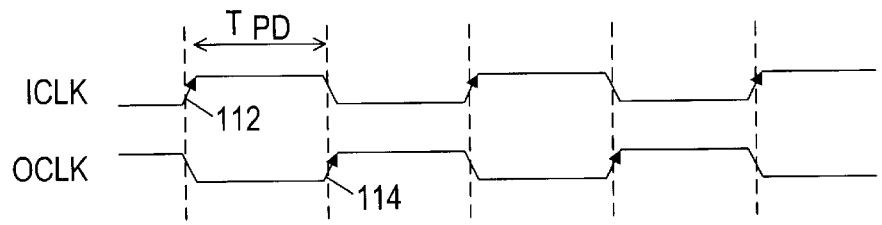
FIG. 3 is a timing diagram for the systems of FIGS. 1 and 2.

The new clock configuration for testing the propagation delay of device 102 is created when signal INBIST is asserted, thereby causing multiplexers 108, 109 to forward clock signals from external clock source TCLK. The presence of inverter 110 ensures that in this configuration, OCLK is an inverted version of ICLK. It is noted that typically it will be unnecessary to maintain two separate clock configurations since the new clock configuration will permit the BIST circuitry to function in the same way as the original clock configuration. Hence, the single clock configuration shown in FIG. 2 may be used. The relationship of ICLK and OCLK in the new mode is shown by the timing diagram in FIG. 3. The arrows indicate edges which serve to trigger test generator 104 and test compactor 106. Thus edge 112 triggers test generator 104 to apply a set of test inputs to device 102, and edge 114 triggers test compactor 106 to latch a set of outputs from device 102. It is noted that the same action may be achieved without the inverter in FIG. 2 if the test compactor 106 is designed to trigger on the negative-going edge of OCLK.

TCLK is distinguished from CLK in that it has variable timing parameters, so that it is possible to vary the time interval $T_{PD}$ between edges 112, 114. In one embodiment this is achieved by varying the frequency of TCLK. In another embodiment, this is achieved by varying the duty cycle of TCLK. In either case, a sequence of test input sets is run through device 102 and verified for one setting of $T_{PD}$. If the test results are valid, it is established that the propagation delay of device 102 is less than or equal to $T_{PD}$. If an actual measurement of the propagation delay of device 102 is desired, the sequence of tests may be repeated with gradually decreasing settings of $T_{PD}$, until a lowest value for which the test results are valid is established. This lowest value then becomes a measurement of the propagation delay of device 102.

Figure 4:
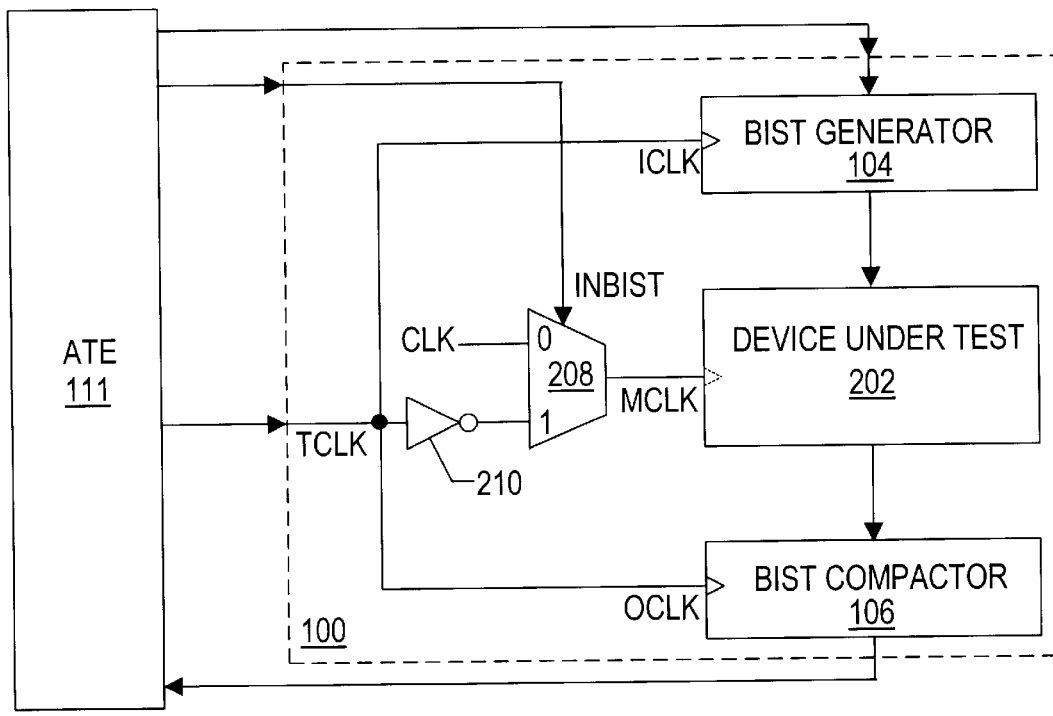
FIG. 4 illustrates a system for determining the propagation time of synchronous embedded cores and integrated circuits.

Turning now to FIG. 4, a system for characterizing the propagation delay time of a clocked (synchronous) integrated circuit device 202 on a chip 100 is shown. It is noted that the device 202 is typically a synchronous embedded core, although this system will operate to characterize the propagation delay of clocked integrated circuits in general. The device 202 has associated with it a test generator 104 and a test compactor 106. As before, the test generator 104 and compactor 106 are preferably BIST modules residing on the chip 100 with device 202. The test generator 104 provides a sequence of test input sets to the device 202. Each test input set includes all the inputs required for the device 202 to perform a desired function. The success of the test is determined by converting a set of outputs from device 202 into a signature which is then forwarded to ATE 111. The conversion is performed by the test compactor 106, and the determination of test success is performed by ATE 111. The test compactor 106 preferably latches the outputs from the device 202 prior to performing the conversion.

A multiplexer 208 forwards one of two clock sources CLK, TCLK to provide the clock input MCLK for device 202. In normal mode, INBIST is de-asserted, and MCLK is driven by clock source CLK, and device 202 operates normally. In test mode ATE 111 asserts INBIST, and MCLK is driven by an inverted signal from clock source TCLK due to the presence of inverter 210. TCLK is also coupled to test generator 104 as clock input ICLK and to test compactor 106 as clock input OCLK.

Figure 5:
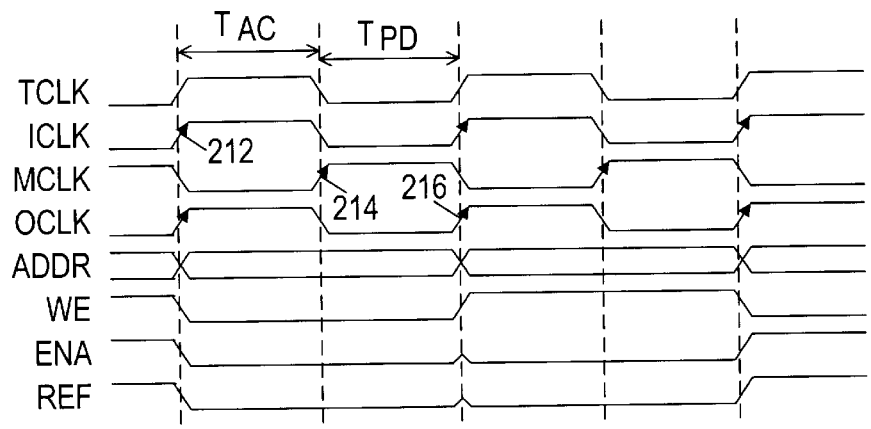
FIG. 5 is a timing diagram for the system of FIG. 4.

The relationship between ICLK, MCLK, and OCLK in test mode is shown in the timing diagram of FIG. 5. The arrows indicate edges which serve to trigger test generator 104, device 202, and test compactor 106. Thus edge 212 triggers test generator 104 to apply a set of test inputs to device 202, edge 214 triggers device 202 to operate on the set of inputs, and edge 216 triggers test compactor 106 to latch a set of outputs from device 202. The time interval $T_{PD}$ between edges 214, 216 is varied to determine the propagation delay of device 202. In one embodiment this may be achieved by varying the frequency of TCLK. In another embodiment, this is achieved by varying the duty cycle of TCLK. In either case, a sequence of test input sets is run through device 202 and verified for one setting of $T_{PD}$. If the test results are valid, it is established that the propagation delay of device 202 is less than or equal to $T_{PD}$. If an actual measurement of the propagation delay of device 202 is desired, the sequence of tests may be repeated with gradually decreasing settings of $T_{PD}$, until a lowest value for which the test results are valid is established. This lowest value then becomes a measurement of the propagation delay of device 202.

One example of a device for which this configuration may be used is an embedded synchronous memory core. The set of inputs to device 202 would then include address signals (ADDR), a write enable signal (WE), a chip enable signal (ENA), and a refresh enable signal (REF). Test generator 104 as part of the test input set provides WE, ENA, REF, and the address signals ADDR. This set of inputs is maintained during edge 214 when device 202 begins operating on these inputs, and is maintained until edge 216 when test compactor 106 latches the outputs. Assume that the minimum cycle time for ATE 111 is 15 ns. By setting the cycle time $T_{AC}+T_{PD}=15$ ns and varying $T_{PD}$, the propagation delay can be characterized in the factory before shipping the product. Examples of settings for propagation delay tests are:

| $T_{AC}$ (ns) | $T_{PD}$ (ns) |
|---|---|
| 12 | 3 |
| 8 | 7 |
| 6 | 9 |
| 5 | 10 |
| 4 | 11 |
| 3 | 12 |

Figure 6:
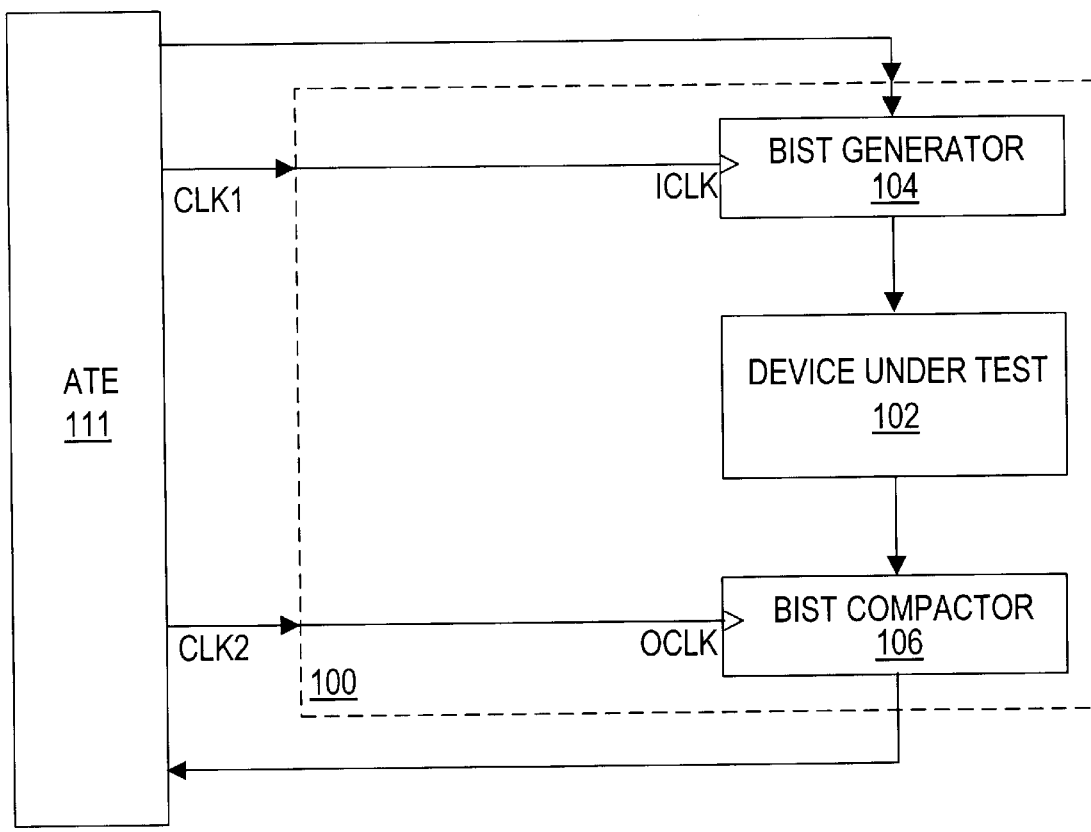
FIG. 6 illustrates another embodiment of a system for determining the propagation delay of an embedded core or other integrated circuit.
Figure 7:
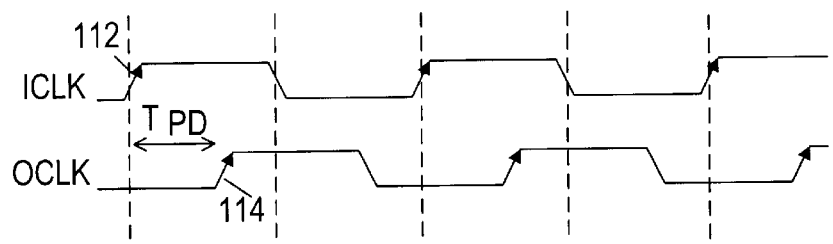
FIG. 7 is a timing diagram for the system of FIG. 6.

For systems requiring very small propagation delay measurements (e.g. $T_{PD}$<3 ns with an ATE incapable of generating pulse widths less than 3 ns), a system using two external clock signals can be used. Turning now to FIG. 6, a system is shown for characterizing the propagation delay time of a very high-speed integrated circuit device 102 on a chip 100. The device 102 has associated with it a test generator 104 and a test compactor 106, as described previously. Two clock sources CLK1, CLK2, are provided by ATE 111to conduct the device tests. CLK1 is coupled to test generator clock input ICLK and CLK2 is coupled to test compactor clock input OCLK. CLK2 is a delayed version of CLK1. The resulting relationship of ICLK and OCLK is shown by the timing diagram in FIG. 7. The arrows indicate edges which serve to trigger test generator 104 and test compactor 106. Thus edge 112 triggers test generator 104 to apply a set of test inputs to device 102, and edge 114 triggers test compactor 106 to latch a set of outputs from device 102.

The delay between CLK1 and CLK2 is adjustable so that it is possible to vary the time interval $T_{PD}$ between edges 112, 114. A sequence of test input sets is run through device 102 and verified for one setting of $T_{PD}$. If the test results are valid, it is established that the propagation delay of device 102 is less than or equal to $T_{PD}$. If an actual measurement of the propagation delay of device 102 is desired, the sequence of tests may be repeated with gradually decreasing settings of $T_{PD}$, until a lowest value for which the test results are valid is established. This lowest value then becomes a measurement of the propagation delay of device 102.

For time delay measurements greater than 3 ns, the variation of the duty cycle of the clock advantageously provides very accurate propagation delay measurements of embedded cores. This is because pulse widths are more easily accurately set than delays between tester channels.

Numerous variations and modifications will become apparent to those skilled in the art once the above disclosure is fully appreciated. It is intended that the following claims be interpreted to embrace all such variations and modifications.

What is claimed is:

1. A method for enabling an automated tester having a minimum cycle time to characterize a propagation delay time of an integrated circuit, wherein said propagation delay time is less than the minimum cycle time, comprising:

coupling a clock signal from the automated tester to the integrated circuit;

triggering a test generator to provide an input to the integrated circuit on a positive-going edge of the clock signal; and latching an output of the integrated circuit on a negative-going edge of the clock signal.

2. The method of claim 1, further comprising:

determining if the output of the integrated circuit is valid;

adjusting a duty cycle of the clock signal; and repeating said triggering, latching, determining, and adjusting steps to find a minimum time interval between the positive-going and negative-going edges which represents the propagation delay time of the integrated circuit.

3. A method for using a built-in self test generator and a built-in self test compactor to characterize a propagation delay time of a high-speed integrated circuit, wherein said method comprises:

providing an external clock signal having a positive edge and a negative edge to the test generator and test compactor, wherein said test generator is configured to apply a set of test inputs to said integrated circuit in response to said positive edge, wherein said test compactor is configured to latch a set of outputs from said integrated circuit in response to said negative edge, and wherein said test compactor is further configured to determine if the set of outputs represent a valid test result.

4. The method of claim 3, further comprising:

monitoring said test compactor determination; and determining that the propagation delay time is less than a time interval between said positive and negative edges if said compactor determination indicates a valid test result.

5. The method of claim 3, further comprising:

decreasing a time interval between said positive and negative edges; and determining that the propagation delay time equals a smallest time interval which produced a test compactor determination indicative of a valid test result.

6. The method of claim 3, further comprising:

increasing a time interval between said positive and negative edges; and determining that the propagation delay time equals a smallest time interval which produces a test compactor determination indicative of a valid test result.

7. The method of claim 5, wherein the time interval is reduced by adjusting a duty cycle of said external clock signal.

8. The method of claim 5, wherein the time interval is reduced by increasing a frequency of said external clock signal.

9. A method for determining a propagation delay time of a high-speed integrated circuit, wherein said method comprises:

providing a first transition of a first polarity in a clock signal and a second transition of a different polarity in said clock signal, wherein said second transition is separated from the first transition by a time interval;

applying a set of test inputs to said integrated circuit in response to said first transition;

latching a set of outputs from said integrated circuit in response to said second transition; and determining if said set of outputs is a valid test result.

10. The method of claim 9, further comprising:

deciding that the propagation delay time is less than said time interval if said determination is indicative of a valid test result.

11. The method of claim 9, further comprising:

iteratively reducing said time interval and executing said providing, applying, latching, and determining steps until one of said determinations is not indicative of a valid test result; and deciding that the propagation delay time is less than a last time interval for which all determinations were indicative of valid test results.

12. A method for determining a propagation delay time of a synchronous integrated circuit, wherein said method comprises:

providing a first transition of a first polarity in a clock signal, a second transition of a different polarity in said clock signal, and a third transition of the first polarity in said clock signal, wherein said second transition is separated from the first by a first time interval, and wherein said third transition is separated from the second transition by a second time interval; and applying a set of test inputs to said integrated circuit in response to said first transition, wherein said set of test inputs includes an asserted enable signal, and wherein said integrated circuit is configured to operate in response to said second transition when said enable signal is asserted;

latching a set of outputs from said integrated circuit in response to said third transition; and determining is said set of outputs is a valid test result.

13. The method of claim 12, further comprising de-asserting said enable signal in response to said third transition.

14. The method of claim 12, further comprising:

deciding that the propagation delay time is less than said second time interval if said determination is indicative of a valid test result.

15. The method of claim 12, further comprising:

iteratively reducing said second time interval and executing said providing, applying, latching, and determining steps until one of said determinations is not indicative of a valid test result; and deciding that the propagation delay time is less than a last time interval for which all determinations were indicative of valid test results.

16. A system for determining a propagation delay of an integrated circuit, wherein said system comprises:

a test generator configured to provide a set of test inputs to said integrated circuit in response to a first transition in a first clock signal;

a test compactor configured to latch a set of outputs from said integrated circuit in response to a second transition in a second clock signal, wherein said test compactor is further configured to determine if the set of outputs indicates a valid test result; and a clock circuit coupled to provide said first and second clock signals, wherein said clock circuit is further configured to provide said second transition at a variable time interval after said first transition, and wherein the system is configured to determine that the propagation delay is less than the variable time interval if the test compactor determines that the set of outputs indicates a valid test result.

17. The system of claim 16, wherein said second clock signal is an inversion of the first clock signal, and wherein the variable time interval is varied by altering a duty cycle of the first clock signal.

18. The system of claim 16, wherein said second clock signal is a delayed version of the first clock signal, and wherein the variable time interval is varied by altering a delay time of the second clock signal.

19. A system for determining a propagation delay of a clocked integrated circuit, wherein said system comprises:

a test generator configured to provide a set of test inputs to said integrated circuit;

a clock circuit configured to provide a first transition of a first clock signal to said integrated circuit to cause said integrated circuit to operate on the set of test inputs, wherein said clock circuit is further configured to provide a second transition of a second clock signal at a variable time interval after said first transition;

a test compactor configured to latch a set of outputs from said integrated circuit in response to said second transition, wherein said test compactor is further configured to determine if the set of outputs indicates a valid test result, and wherein the system is configured to determine that the propagation delay time is less than the variable time interval if the test compactor determines that the set of outputs indicates a valid test result.

20. The system of claim 19, wherein said second clock signal is an inversion of the first clock signal, and wherein the variable time interval is varied by altering a duty cycle of the first clock signal.

21. The system of claim 19, wherein said second clock signal is a delayed version of the first clock signal, and wherein the variable time interval is varied by altering a delay time of the second clock signal.

* * * * *